United States Patent [19]

Berger et al.

[11] Patent Number: 4,615,968
[45] Date of Patent: Oct. 7, 1986

[54] COMPOSITIONS OF MATTER WHICH CROSSLINK UNDER THE ACTION OF LIGHT IN THE PRESENCE OF SENSITIZERS

[75] Inventors: Joseph Berger, Basel; Friedrich Lohse, Oberwil, both of Switzerland

[73] Assignee: Ciba-Geigy Corporation, Ardsley, N.Y.

[21] Appl. No.: 545,555

[22] Filed: Oct. 26, 1983

[30] Foreign Application Priority Data

Nov. 4, 1982 [CH] Switzerland .................. 6417/82

[51] Int. Cl.$^4$ .................. G03C 1/70; C08F 8/30
[52] U.S. Cl. .................. 430/283; 430/285; 430/286; 430/927; 522/96; 522/107; 522/137; 522/53
[58] Field of Search .............. 430/286, 283, 285, 927; 204/159.15; 522/96, 107, 137, 53

[56]  References Cited

U.S. PATENT DOCUMENTS

| | | | |
|---|---|---|---|
| 3,556,791 | 1/1971 | Suzuki et al. | 430/285 X |
| 3,622,321 | 11/1971 | Heverlee et al. | 204/159.22 X |
| 3,832,187 | 8/1974 | Kleeberg et al. | 522/96 X |
| 4,072,524 | 2/1978 | Kleeberg et al. | 522/107 X |
| 4,077,918 | 3/1978 | Corte et al. | 525/333.6 |
| 4,079,041 | 5/1978 | Baumann et al. | 430/270 X |
| 4,269,680 | 5/1981 | Rowe | 204/159.17 |
| 4,283,509 | 8/1981 | Zweifel et al. | 430/287 X |
| 4,385,154 | 5/1983 | Cassat et al. | 525/47 |

FOREIGN PATENT DOCUMENTS

| | | | |
|---|---|---|---|
| 58-13630 | 1/1983 | Japan | 204/159.15 |
| 2050378 | 1/1981 | United Kingdom . | |

OTHER PUBLICATIONS

T. F. Saunders, G. P. Schmitt and R. Srinivasan, "Photosensitive Polyimide Coatings", *IBM Technical Disclosure Bulletin*, vol. 16, No. 2, Jul. 1973, pp. 601–602.

*Primary Examiner*—John E. Kittle
*Assistant Examiner*—Cynthia Hamilton
*Attorney, Agent, or Firm*—Luther A. R. Hall; Michael W. Glynn

[57] ABSTRACT

Novel compositions of matter which crosslink under the action of light and which contain (A) an aliphatically unsaturated polycondensation product which can contain structural elements of the formula I

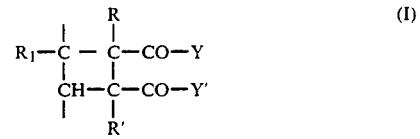

(B) a bisimide of the formula II

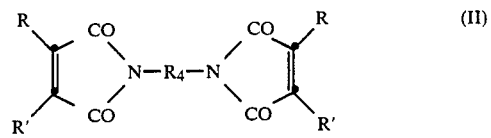

and a sensitizer and can, if desired, also contain a further crosslinking agent, where R, R', R$_1$, Y, Y' and R$_4$ are as defined in claim 1, are suitable, inter alia, for preparing printing plates or for use as photoresist materials.

15 Claims, No Drawings

COMPOSITIONS OF MATTER WHICH CROSSLINK UNDER THE ACTION OF LIGHT IN THE PRESENCE OF SENSITIZERS

The present invention relates to novel compositions of matter which crosslink under the action of light in the presence of sensitisers, to crosslinked products which can be obtained therefrom, and to novel intermediates.

German Offenlegungsschrift No. 2,626,769 and European Patent Application Publication No. 3,552 disclose photocrosslinking polymers having imidyl side groups, in particular dimethylmaleiimidyl and certain tricyclic imidyl groups. However, in some instances their light-sensitivity still leaves something to be desired.

The invention provides novel compositions of matter which crosslink under the action of light in the presence of sensitisers and which contain (A) an aliphatically unsaturated polycondensation product which can contain structural elements of the formula I

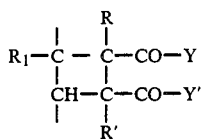

and (B) a bisimide of the formula II

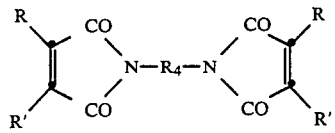

in which R and R' independently of each other are each $C_{1-4}$-alkyl or together tetramethylene which is unsubstituted or substituted by a methyl group, or a grouping of the formula III

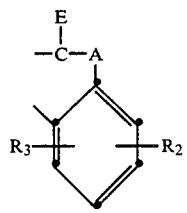

$R_1$ is hydrogen or methyl, $R_2$ and $R_3$, independently of each other, are each hydrogen, halogen, $C_{1-4}$-alkyl or methoxy, A is $-CH_2-$, $-CH_2CH_2-$ or $-OCH_2-$ with oxygen bonded to the aromatic ring, and E is hydrogen, or A is $-O-$ and E is $-CH_3$, $R_4$ is $-C_mH_{2m}-$ with m=1 to 20, $-(CH_2)_xQ(CH_2)_{x'}-$, $-(CH_2)_2NH(CH_2)_2NH(CH_2)_2-$, $-CH_2-Z-CH_2-$, phenylene which is unsubstituted or substituted by one or two chlorine atoms or one or two methyl groups, naphthylene or a group of the formula

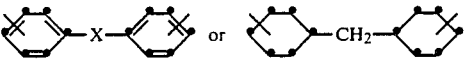

Q is $-S-$, $-O-$ or in particular $-NH-$, x and x', independently of each other, are each a number from 2 to 4, preferably 2, Z is phenylene or $C_{4-6}$-cycloalkylene, X is a direct bond, $-O-$, $-S-$, $-SO_2-$, $-CH_2-$ or $-C(CH_3)_2-$, and Y and Y' are each $-OH-$ or together $-O-$, and the proportion of bisimide of the formula II is 0.1 to 75% by weight, preferably 1 to 25% by weight, based on polymer (A), and (C) a photosensitizer.

R, R', $R_2$ and $R_3$ alkyl groups can be straight-chain or branched. Examples of such groups are methyl, ethyl, n-propyl, isopropyl, n-butyl and sec.-butyl. A preferred alkyl group has 1 or 2 carbon atoms and is in particular methyl.

If R and R' together are a grouping of the formula III, E, $R_2$ and $R_3$ preferably are each hydrogen, and A is $-CH_2-$. R and R' together are preferably tetramethylene, 3- or 4-methyltetramethylene or especially are each methyl.

An $R_4$ $-C_mH_{2m}-$ can be a straight-chain or branched radical, for example methylene, ethylene, 1,2- or 1,3-propylene, tetramethylene, 1,1,3,3-tetramethylbutylene, pentamethylene, hexamethylene, heptamethylene, octamethylene, nonamethylene, decamethylene, undecamethylene, tridecamethylene, tetradecamethylene, hexadecamethylene, heptadecamethylene, octadecamethylene or eicosylene. Preferred $-C_mH_{2m}-$ radicals are straight-chain with m=2-20. An $R_4$ $-CH_2-Z-CH_2-$ group can be, for example, a 1,3- or 1,4-phenylene group or a 1,2-cyclobutylene, 1,3-cyclopentylene or 1,3-cyclohexylene group. Z is preferably 1,3- or 1,4-phenylene or 1,3- or 1,4-cyclohexylene.

A phenylene $R_4$ which is unsubstituted or substituted by one or two chlorine atoms or one or two methyl groups can be, for example, the 1,3- or 1,4-phenylene, o- or m-toluylene, 4,5-dimethyl-1,2-phenylene or 3-chloro-1,4-phenylene group. An $R_4$ group

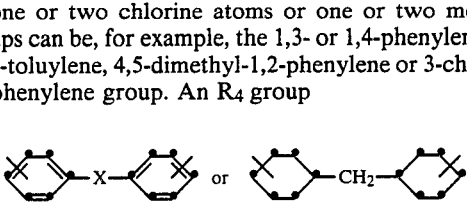

is in particular the radical of 4,4'-diaminodiphenylmethane, 4,4'-diaminodiphenyl ether, 4,4'-diaminodiphenyl sulfide or 4,4'-diaminodicyclohexylmethane. $R_4$ is preferably straight-chain $-C_mH_{2m}-$ with m=2-10, $-(CH_2)_2Q(CH_2)_2-$ with Q=$-S-$, $-O-$ or in particular $-NH-$, $-CH_2-Z-CH_2-$ with Z=1,3- or 1,4-phenylene or 1,3- or 1,4-cyclohexylene; or the radical of 4,4'-diaminodiphenylmethane, 4,4'-diaminodiphenyl ether or 4,4'-diaminodiphenyl sulfide, or 1,3- or 1,4-phenylene.

In very particularly preferred compositions of matter, R and R' are each methyl, $R_1$ is hydrogen, Y and Y' together are $-O-$, and $R_4$ is $-(CH_2)_2NH(CH_2)_2-$ or especially straight-chain $-C_mH_{2m}-$ with m=2-10.

The polymers to be used according to the invention preferably have an average molecular weight of 1,000 to 1,000,000 and very particularly from 1,000 to 350,000. The average molecular weight of the polymers can be determined by methods known per se, for example by means of light-scattering, vapour pressure osmometry or ultracentrifugation.

Examples of suitable unsaturated polycondensation products are unsaturated polyamides, polyesters, polyesteramides and polyurethanes.

Polycondensation products which are preferably used contain recurring structural elements of the formulae IV to X

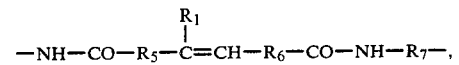   (IV)

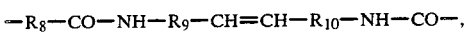   (V)

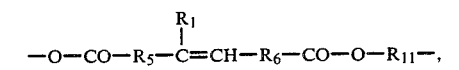   (VI)

   (VII)

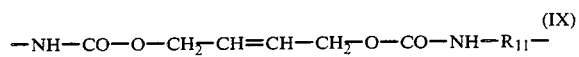   (VIII)

   (IX)

or $-O-CO-NH-R_{12}-CH=CH-R_{13}-NH-CO-O-R_{11}-$   (X)

and can also contain corresponding saturated recurring structural elements which are obtained by partial addition of anhydrides of the formula XI

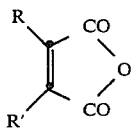   (XI)

onto the C=C double bonds of the starting polymers with structural elements of the formulae IV to X and possible hydrolysis of the anhydride groups, where R, R' and $R_1$ are as defined under the formula I, $R_5$ and $R_6$, independently of each other, are each a direct bond or —$CH_2$—, or one of $R_5$ and $R_6$ is a direct bond and the other is —CH=CH— or —(CH$_2$)$_8$—, $R_7$ is the radical of an aromtic diamine, in particular 1,3- or 1,4-phenylene, the radical of 4,4'-diaminodiphenylmethane or 4,4'-diaminodiphenyl ether, or the radical of an aliphatic diamine having 1–16 carbon atoms, in particular —$C_oH_{2o}$— with o=2–7, $R_8$ is the radical of an aromatic dicarboxylic acid, in particular the radical of terephthalic acid or isophthalic acid, or the radical of an aliphatic dicarboxylic acid which can have C=C double bonds and has at least 6 carbon atoms, in particular —(CH$_2$)$_p$— with p=4–12 and especially 4–8, $R_9$ and $R_{10}$, independently of each other, are aliphatic radicals which are substituted or unsubstituted and/or have C=C double bonds and have a total of 4–12 carbon atoms in the main chains, $R_{11}$ is a benzene radical,

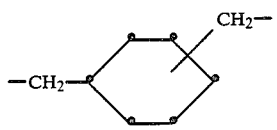

or —$C_qH_{2q}$— with q=2–10, in particular 2–4, and $R_{12}$ and $R_{13}$, independently of each other, are each —(CH$_2$)$_r$— with r=1–5.

In the formulae IV and VI, $R_5$ and $R_6$ preferably each are a direct bond and $R_1$ is methyl or in particular hydrogen, or $R_1$ is hydrogen and $R_5$ and $R_6$ each are —CH$_2$—. It is very particularly preferable that, in the formulae IV and VI, $R_1$ is hydrogen and $R_5$ and $R_6$ are each a direct bond.

Said polymers can be homopolymers or copolymers, for example copolyesters of HO—$R_{11}$—OH diols and mixtures of unsaturated and saturated dicarboxylic acids, such as mixtures of maleic anhydride and terephthalic acid or derivatives thereof.

Preferred polyesters consist of recurring structural elements of the formula VIa

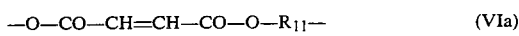   (VIa)

with or without recurring structural elements of the formula VIb and/or Ia

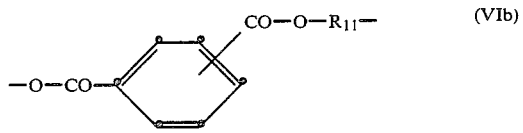   (VIb)

and/or

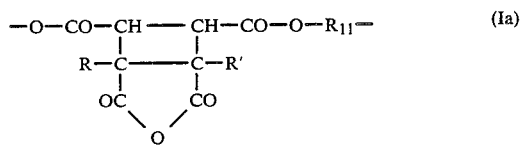   (Ia)

in which R and R' together are tetramethylene or, especially, are each methyl, and $R_{11}$ is a

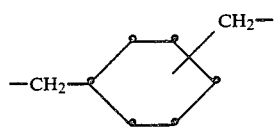

group, in particular

or —(CH$_2$)$_s$— with s=2–12, in particular 2–4. The proportion of structural elements of te formula Ia can amount to 95%, in particular 30 to 85%, of the total number of recurring structural elements of the polyester. Preferred polyesters consist of structural elements of the formula VIa with or without structural elements of the formula VIb.

Polyamides which are used very particularly preferably consist of recurring structural elements of the formula Va

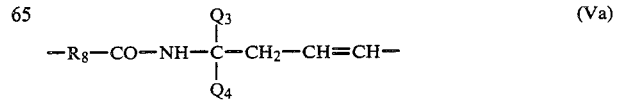   (Va)

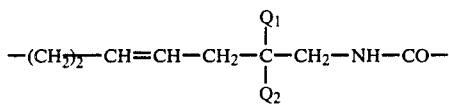

with or without recurring structural elements of the formulae Ib, Ic and/or Id

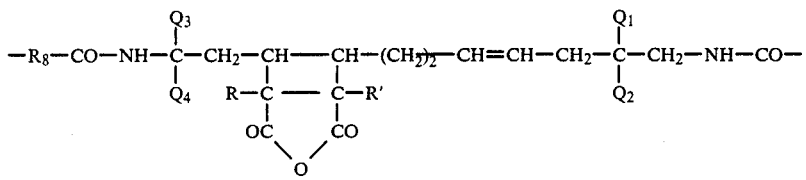

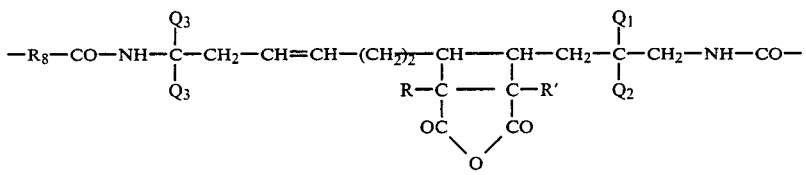

and/or

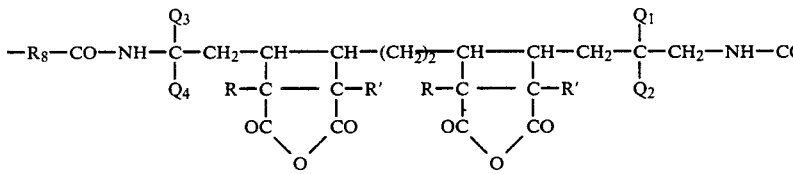

in which R and R' together are tetramethylene or, especially, are each methyl, $Q_1$ is $C_{1-12}$-alkyl, $Q_2$ is hydrogen or $C_{1-12}$-alkyl, $Q_3$ is $C_{1-12}$-alkyl, cycloalkyl having 4-12 ring carbon atoms, aralkyl having 7 or 8 carbon atoms, or phenyl, and $Q_4$ is hydrogen, $C_{1-12}$-alkyl, cycloalkyl having 4-12 ring carbon atoms, aralkyl having 7 or 8 carbon atoms, or phenyl, or $Q_1$ and $Q_2$ and/or $Q_3$ and $Q_4$ together are alkylene having 3-11 carbon atoms, and $R_8$ is the radical of terephthalic acid, isophthalic acid and/or of a saturated aliphatic dicarboxylic acid having 6-12 carbon atoms. The proportion of structural elements of the formulae Ib, Ic and/or Id can amount to 95%, in particular 20-90%, of the total number of recurring structural elements of the polyamide.

Preferably, $Q_1$ is $C_{1-5}$-alkyl and $Q_2$ is hydrogen or $C_{1-5}$-alkyl, or $Q_1$ and $Q_2$ together are alkylene having 4-7 carbon atoms, $Q_3$ is $C_{1-7}$-alkyl, $C_{5-8}$-cycloalkyl or phenyl, in particular $C_{1-5}$-alkyl or phenyl, and $Q_4$ is hydrogen or $C_{1-5}$-alkyl, in particular hydrogen or methyl.

Particularly preferably, $Q_1$ is methyl or ethyl, $Q_2$ is hydrogen, methyl or ethyl, $Q_3$ is $C_{1-5}$-alkyl or phenyl, $Q_4$ is hydrogen or methyl and $R_8$ is the radical of terephthalic acid, isophthalic acid and/or a saturated aliphatic dicarboxylic acid having 6-10 carbon atoms.

Very particularly preferred polymers consist of recurring structural elements of the formula Va with or without recurring structural elements of the formulae Ib, Ic and/or Id in which R and R' together are tetramethylene or in particular are each methyl, $Q_1$ and $Q_2$ are each methyl, $Q_3$ is isopropyl, $Q_4$ is hydrogen, and $R_8$ is the radical of terephthalic acid, isophthalic acid and/or adipic acid, especially those wherein $Q_1$ and $Q_2$ are each methyl, $Q_3$ is isopropyl, $Q_4$ is hydrogen, and $R_8$ is the radical of terephthalic acid and/or the radical of adipic acid, where the proportion of structural elements of the formulae Ib, Ic and/or Id can amount to 40–85%, based on the diamine components of the polyamide. The most preferred polyamides consist solely of recurring structural elements of the formula Va in which $Q_1$ to $Q_4$ and $R_8$ are as preferred above.

Aliphatically unsaturated polycondensation products which incorporate recurring structural elements of the formula I are novel and are likewise part of the subject-matter of the present invention, what was said above also applying to preferred definitions of $R_1$, R, R', Y and Y' and to preferred unsaturated polycondensation products which have partly been modified with

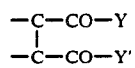

groups. Polymers having structural elements of the formula I can be obtained by reacting aliphatically unsaturated polycondensation products with a compound of the formula XI under free-radical conditions or under the action of light, and if desired hydrolysing the anhydride groups. The reaction is advantageously carried out in an inert gas atmosphere, for example under nitrogen, and in the presence of an inert organic solvent and of a sensitiser of the type described below. Examples of suitable solvents are aliphatic, cycloaliphatic or aromatic hydrocarbons which can be halogenated, such as pentane, hexane, heptane, cyclohexane, benzene, toluene, chlorobenzene, dichlorobenzenes, cyclic or aliphatic amides, such as N-methylpyrrolidone, N-ethyl-2-pyrrolidone, N-methyl-ε-caprolactam, N,N-dimethylformamide, N,N-dimethylacetamide or N,N-diethylacetamide, aliphatic or cyclic ketones, such as acetone, methyl ethyl ketone, cyclohexanone or cyclopentanone, and alcohols, such as methanol, ethanol or 2-methoxyethanol. It is also possible to use mixtures of said solvents. The preferred solvent is N,N-dimethylformamide.

The compounds of the formula XI and the polymers having structural elements of the formulae IV to X are known or can be prepared by methods known per se. Compounds of the formula II can be obtained in a manner known per se by reacting a compound of the formula XI with $H_2N-R_4-NH_2$ diamines and cyclising the amide acids formed as intermediates. The compounds of the formula II in which R and R' together are a tetramethylene which is unsubstituted or substituted by a methyl group, and $R_4$ is as defined above, are novel and a further part of the subject-matter of the present invention, what was said above also applying to preferred definitions of $R_4$, and R and R' preferably together being tetramethylene. The unsaturated diamines required for preparing polymers having recurring structural elements of the formula V can be obtained by, for example, directly reducing oximes of the formula XII

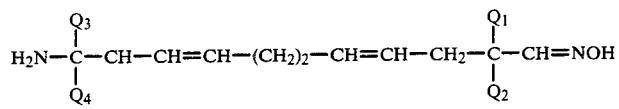

to the corresponding diamines, or first dehydrating the oximes to the corresponding nitriles and reducing the nitriles to the diamines. The oximes of the formula XII are known or can be prepared by the process described in European Patent Application Publication No. 11,599.

The compositions of matter according to the invention can contain, in addition to the sensitisers, customary additives, such as further crosslinking agents. Possible additional crosslinking agents are in particular diamines, for example those of the type described in German Offenlegungsschrift No. 2,657,104. Suitable sensitisers are in particular triplet sensitisers on whose application the reaction takes place by triplet energy transfer from the excited sensitiser to the groundstate compounds of the formula II, for example ketones, for example acetophenone, benzophenone, acetone, methyl ethyl ketone, methyl isobutyl ketone, Michler's ketone, 1,2-dibenzilbenzene, 1,4-diacetylbenzene, 4-cyanobenzophenone, thioxanthone, anthraquinone, 1,2- and 1,4-naphthoquinone, 2-methylanthraquinone, benzanthrone, violanthrone, p,p'-tetramethyldiaminobenzophenone, or chloroanil, anthracene, chrysene, or nitro compounds, such as nitrobenzene, p-dinitrobenzene, 1- or 2-nitronaphthalene, 2-nitrofluorene, 5-nitroacenaphthene, nitroaniline, 2-chloro-4-nitroaniline or 2,6-dichloro-4-nitroaniline. The sensitisers used can also be free-radical initiators, such as azoisobutyronitrile, or peroxides, for example dibenzoyl peroxide. The sensitisers which are preferably used are unsubstituted thioxanthone or substituted thioxanthones, for example those of the type described in German Offenlegungsschriften No. 3,018,891 and No. 3,177,568 and European Patent Application Publication No. 33,720.

The invention also relates to the crosslinked products which can be obtained by crosslinking a composition of matter of the type defined under the action of light in the presence of a sensitiser and in the presence or absence of a further crosslinking agent. Examples of possible sensitisers are those of the abovementioned type.

UV light is preferably used for irradiating the crosslinking reactions as well as the possible preceding reaction of the polymers with the anhydrides of the formula XI. Examples of suitable light sources are xenon lamps, carbon arcs, mercury lamps and metal halide/mercury lamps.

The compositions of matter according to the invention are suitable, for example, for preparing solvent-resistant coatings on various substrates, in particular metals, such as aluminium, copper and steel, or plastics, for example polyesters, cellulose acetate and the like, or for preparing offset printing plates, for preparing photooffsetresists, or for unconventional photography, for example for preparing, by means of photocrosslinking, photographic images which can be coloured with cationic dyes. They are preferably used for preparing printing plates or as photoresists materials for manufacturing printed circuits by methods known per se. In the latter application, that face of the conductor board which has been provided with the light-sensitive layer is exposed through a photomask incorporating the circuit diagram and is then developed, whereupon the unexposed areas of the layer are removed by means of developing liquid.

Compositions of matter in which the polymer has structural elements of the formula I are systems which can be developed under aqueous or aqueous-alkaline conditions, which can be an ecological advantage over developing baths based on organic solvents. Systems of this type can also be colured with cationic dyes. The support materials can be coated with light-sensitive compositions of matter by techniques which are customary per se, for example by dipping, spraying, whirler-coating, cascade-coating, knife-coating, curtain-coating or roller-coating.

The compositions of matter according to the invention are distinguished in particular by a high degree of light-sensitivity. The crosslinked products which can be obtained therefrom are highly solvent-resistant, for example in isopropanol, and highly abrasion-resistant and firmly adhere to various support materials, in particular metals.

EXAMPLES 1-5

An amount of diemthylmaleic anhydride as specified in Table I, below, and 0.25 g of thioxanthone in 80 ml of DMF are added dropwise at 20° C. under nitrogen and with irradiation in the course of 2 hours to a solution of 5.0 g of a polyamide of adipic acid and 2,2-dimethyl-11-isopropyl-1,11-diaminoundeca-4,8-diene (DUD) in 70 ml of N,N-dimethylformamide (DMF) in a UV reactor (a flask which has been equipped with a 125-W Philips HPK dip lamp). Irradiation of the solution is then continued for a further 20 hours, and the solution is concentrated to a third of its volume. The polymer is precipitated by pouring the solution into 2 liters of diethyl ether. The analytical data of the polymers obtained have been compiled in Table I.

The polyamide used can be prepared as follows: 62.8 g of 2,2-dimethyl-11-isopropyl-1,11-diaminoundeca-4,8-diene, 36.4 g of adipic acid, 0.25 ml of a 10% aqueous $NH_4H_2PO_2$ solution and 0.5 g of di-tert.-butyl-p-cresol are condensed for 90 minutes in a nitrogen atmosphere in an autoclave, then for 4 hours in a nitrogen stream in an open polycondensation vessel and finally for 1 hour under high vacuum. All polycondensation steps are carried out at 250° C. Elemental analysis of the polyamide obtained:

| calculated | C 72.88% | H 10.57% | N 7.73% |

-continued

| found | C 70.20% | H 10.47% | N 7.45%. |
|---|---|---|---|

Terminal group content: —COOH 0.16 mEq/g; —NH$_2$ 0.04 mEq/g. Glass transition temperature (Tg, determined in a differential scanning calorimeter)=45° C.; reduced viscosity $\eta$ red.=0.70 dl/g (measured as an 0.5% solution in m-cresol at 25° C.).

The diamine used can be prepared as follows:

100 ml of glacial acetic acid are added with stirring to 80 g (0.3 mole) of 2,2-dimethyl-11-isopropyl-11-aminoundeca-4,8-dienaloxime. HCl gas is then passed in until saturation is reached, and 30.6 g (0.3 mole) of acetic anhydride are added dropwise in the course of 15 minutes. The reaction mixture is then refluxed for 4 hours, the glacial acetic acid is distilled off, and the residue is dissolved in water. After the solution has been rendered basic using sodium hydroxide solution, the organic phase which separates out is taken up in toluene and distilled, affording 68.5 g (0.276 mole) of 1,1-dimethyl-10-isopropyl-10-aminodeca-3,7-dienonitrile, which corresponds to a yield of 92% of theory; boiling point 94° C.: 3 Pa.

23 g (1 mole) of sodium are added to 150 ml of toluene, and the mixture is heated until the sodium melts. The heating is then removed, and the mixture is stirred until the sodium is in the form of a fine grey dispersion. A solution of 53 g (0.214 mole) of 1,1-dimethyl-10-isopropyl-10-aminodeca-3,7-dienonitrile in 100 ml of isopropanol is then added dropwise to this mixture, which is then refluxed for 3 hours. 200 ml of water are added, and the organic phase is separated off. The solvent is distilled off to give 44 g (0.175 mole) of 2,2-dimethyl-11-isopropyl-1,11-diaminoundeca-4,8-diene, which corresponds to a yield of 81.5% of theory; boiling point 86° C./1 Pa; n$_d^{20}$=1.4810.

70.0%); red.=0.29 dl/g (0.5% solution in m-cresol at 25° C.); Tg=55° C. Elemental analysis: C 65.90% H 8.70% N 5.86%. Total acid content in the polymer: 3.98 m#Eq/g, which corresponds to a 66.3% conversion of the C=C double bonds in the polymer by the 3,4,5,6-tetrahydrophthalic anhydride.

EXAMPLES 7-9

0.3 g of the polyamide described in Example 2 (modified with dimethylmaleic anhydride), 17 mg of thioxanthone and the particular amount of N,N'-ethylenebis-dimethylmaleimide indicated in Table II, below, are dissolved in 7.0 g of DMF. The solution is applied onto a copper conductor board using a 75 m doctor and is dried at 100° C. in the course of 4 minutes. The coating is then exposed through a photographic mask incorporating a step wedge (21 step sensitivity guide from Stouffer) to the light of a 5,000-W high pressure burner a distance of 70 cm away, then dipped into 5% NaOH for 30 seconds, washed briefly with deionised water, dipped into 5% HCl for 30 seconds and etched in FeCl$_3$ solution. The durations of exposure to light and the corresponding steps depicted on the step wedge are given in Table II.

TABLE II

| Example No. | Amount of bismaleimide used (mg/% by weight) | Duration of exposure to light (seconds) | Final step depicted |
|---|---|---|---|
| 7 | 60 mg/20% by weight | 30 | 2 |
|   |   | 60 | 3 |
|   |   | 120 | 6 |
| 8 | 30 mg/10% by weight | 30 | 2 |
|   |   | 60 | 3 |
|   |   | 120 | 6 |
| 9 | 15 mg/5% by weight | 30 | none |
|   |   | 60 | 2 |
|   |   | 120 | 4 |

TABLE I

| Example No. | Amount of dimethylmaleic anhydride used (g/% based on double bonds in the polymer) | Polymer end product | | | | | | |
|---|---|---|---|---|---|---|---|---|
| | | Glass transition temperature Tg in °C. | $\eta$ red. (dl/g)[1] | C % | H % | N % | Total acid content mEq/g | Conversion of DUD (%)[2] |
| 1 | 1.73 g/50% | 53 | 0.49 | 66.93 | 9.45 | 7.00 | 2.77 | 42.55 |
| 2 | 2.07 g/60% | 40 | 0.46 | 66.80 | 9.08 | 7.00 | 3.11 | 47.77 |
| 3 | 2.59 g/75% | 56 | 0.39 | 66.75 | 8.90 | 6.50 | 3.39 | 52.07 |
| 5 | 3.46 g/100% | 83 | 0.48 | 66.80 | 8.70 | 5.50 | 4.98 | 77.33 |
| 5 | 4.15 g/120% | 90 | 0.47 | 66.00 | 8.28 | 5.29 | 5.37 | 83.39 |

[1]0.5% solution in m-cresol at 25° C.
[2]converted double bonds in the polymer in % (100% = 6.44 mEq/g)

EXAMPLE 6

A solution of 5.0 g of the starting polyamide described in Example 1 in 70 ml of DMF in a flask which has been equipped with a magnetic stirrer, a nitrogen-inlet and -outlet and a 125-W Philips HPK dip lamp has added to it dropwise at 20° C. in the course of 2.5 hours after the lamp has been switched on and as nitrogen passes through 4.20 g of 3,4,5,6-tetrahydrophthalic anhydride and 0.25 g of thioxanthone in 80 ml of DMF. Afterwards the solution is irradiated for a further 15.5 hours under nitrogen. Half of the solvent is drawn off. The remaining solution has added to it 10 ml of water, is heated at 80° C. for 5 minutes, and is cooled down. The product is precipitated in 2 liters of diethyl ether. The precipitated product is filtered off and dried in vacuo at 20° C. yield of polyamide: 7.94 (conversion

EXAMPLE 10

0.5 g of the starting polyamide described in Example 1, 0.25 g of N,N'-octamethylenebisidmethylamaleimide and 40 mg of thioxanthone are dissolved in a mixture of 4.5 g of methylcellosolve, 2.25 g of methyl ethyl ketone and 1 g of chloroform (ratio 6:3:1). The solution is applied to a copper conductor board by means of a 50 $\mu$m doctor and dried at 100° C. in the course of 3 minutes. The coating is then exposed through a step wedge of the type described in Examples 7-9 to the light from a 5,000-W high pressure burner and is developed in the solvent mixture described above in the course of 30 seconds. The following results are obtained:

| Duration of exposure to light (seconds) | Final step depicted |
|---|---|
| 300 | 10 |
| 420 | 12. |

EXAMPLE 11

0.5 g of a polyester preapred from 100 parts by weight of 1,3-propylene glycol, 72 parts by weight of maleic anhydride and 54 parts by weight of phthalic anhydride and having a viscosity of 1,000 mPa.s at 20° C., 0.25 g of N,N'-octamethylenebisdimethylmaleimide and 37 mg of thioxanthone are dissolved in 6.75 g of chloroform. The solution is applied to a copper conductor board by means of a 50 m doctor and is dried at 100° C. in the course of 3 minutes. The coating obtained is transparent and glossy. The coating is then exposed through a step wedge of the type described above to the light from a 5,000-W high pressure burner a distance of 70 cm away and is developed in a chloroform/ethanol solvent mixture (1:1) in the course of 1 minute.

The following results are obtained:

| Duration of exposure to light (seconds) | Final step depicted |
|---|---|
| 90 | 4 |
| 180 | 6. |

The ratio of double bonds in the starting polymer to the bisimide is 0.6.

EXAMPLE 12

1.0 g of the polyamide prepared in Example 2 where it was modified with dimethylmaleic anhydride, 0.20 g of N,N-octamethylenebisdimethylmaleimide and 60 g of thioxanthone are dissolved in 24 g of chloroform. The solution is applied to a copper conductor board by means of a 50 μm doctor and is dried at 100° C. in the course of 4 minutes. The coating is exposed for 30 seconds through a step wedge of the type described above to the light from a 5,000-W high pressure burner a distance of 70 cm away, then dipped at 30° C. into 5% NaOH for 30 seconds, washed briefly with deionised water, dipped into 5% HCl for 30 seconds and etched in an FeCl$_3$ solution.

Final step depicted: 6. The image is readily etched.

EXAMPLE 13

0.5 g of the polyamide prepared in Example 1 where it was modified with dimethylmaleic anhydride, 50 or 100 mg of the bisimide of the formula

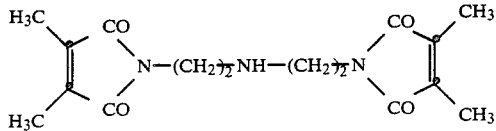

and 30 mg of thioxanthone are dissolved in 9.5 g of DMF. The solution is applied to a copper conductor board by means of a 24 μm doctor and is dried at 125° C. in the course of 4 minutes. The coating is exposed for 30 seconds through a step wedge of the type described above to the light of a 5,000-W high pressure burner a distance of 70 cm away, is then dipped into 5% NaOH for 1 minute, is then dipped into 5% HCl for 30 seconds, and is etched in FeCl$_3$ solution. Final step depicted on using 50 mg of bisimide: 2 Final step depicted on using 100 mg of bisimide: 1

EXAMPLES 14–16

0.5 g of a polyamide from 2,2-dimethyl-11-isopropyl-1,11-diaminoundeca-4,8-diene and adipic acid [prepared analogously to the method described in Examples 1–5; Tg=58° C., η red.=0.65 dl/g, 5% solution in m-cresol at 25° C.], 50 mg of one of the following bisimides:
(A) mixture of N,N'-hexamethylenebis-(3-methyl-3,4,5,6-tetrahydrophthalimide) and N,N'-hexamethylenebis-(4-methyl-3,4,5,6-tetrahydrophthalimide) (ratio about 15:85% by weight),
(B) N,N'-hexamethylenebis-3,4,5,6-tetrahydrophthalimide and
(C) N,N'-hexamethylenebis-dimethylmaleimide, and 27.5 mg of ethyl thioxanthone-7-methyl-3-carboxylate are dissolved in 11 g of chloroform. The resulting solution is applied to a copper conductor board by means of a 50 μm doctor and is dried at 80° C. in the course of 3 minutes. The coating is then exposed through a Stouffer step wedge (21 step sensitivity guide) to the light of a 5,000-W high pressure burner a distance of 70 cm away. The unexposed areas are dissolved out by washing in chloroform (30 seconds). The results are given in Table III, below.

TABLE III

| Duration of exposure to light (seconds) | Final wedge step depicted using bisimide | | |
|---|---|---|---|
| | A (Example 14) | B (Example 15) | C (Example 16) |
| 15 | none | 1 | 2 |
| 30 | none | 3 | 4 |
| 45 | 1 | 4 | 5 |
| 120 | 4 | 7 | 9 |

The novel bisimides (A) and (B) used in Examples 14 and 15 above can be prepared as follows:
(a) 23.2 g (0.2 mole) of 1,6-diaminohexane and 66.4 g (0.4 mole) of a mixture of about 15% by weight of 3-methyl-1-cyclohexene-1,2-dicarboxylic anhydride and about 85% by weight of 4-methyl-1-cyclohexene-1,2-dicarboxylic anhydride are dissolved in 350 ml of toluene. The water formed is separated off under reflux in the course of 24 hours. 300 ml of toluene are then distilled off, the the crystals formed are filtered off and washed with cyclohexane, and the crude product is recrystallised from methanol, affording 35 g (42.5% of theory) of a mixture of about 15% by weight of N,N'-hexamethylenebis-3-methyl-3,4,5,6-tetrahydrophthalimide) and about 85% by weight of N,N'-hexamethylenebis-(4-methyl-3,4,5,6-tetrahydrophthalimide). Melting point 93°–95° C. Elemental analysis:

| | | | |
|---|---|---|---|
| calculated | C 69.88 | H 7.82 | N 6.79% |
| found | C 70.0 | H 7.8 | N 6.7%. |

Thin layer chromatogram with toluene/ethanol in a ratio by volume of 80:20 as solvent: 1 main spot.
(b) 23.2 g (0.2 mole) of 1,6-diaminohexane and 60.8 g (0.4 mole) of 1-cyclohexene-1,2-dicarboxylic anhydride are dissolved in 350 ml of toluene, and the water formed is separated off under reflux in the course of 20 hours. 300 ml of toluene are then distilled off, and the precipitated product is filtered off, washed with toluene/cyclohexane and recrystallised from 600 ml of methanol. The resulting white crystalline proudct is dried at 60° C. in vacuo in the course of 24 hours, affording 50 g (64.1% of theory) of N,N'-hexamethylenebis-3,4,5,6-tetrahydrophthalimide; melting point 123°-124° C. Elemental analysis:

| calculated | C 68.73% | H 7.34% | N 7.4% |
|---|---|---|---|
| found | C 68.9% | H 7.4% | N 7.4%. |

Thin layer chromatogram with toluene/ethanol (ratio by volume 80:20) as solvent: 1 spot.

EXAMPLE 17

(a) A flask which has been equipped with a nitrogen-inlet and -outlet, a condenser and a stirrer is charged with 72 g of diphenyl adipate, 21.26 g of cis-2-butene-1,4-diol and 200 ppm of titanium tetraisopropylate. The flask is then flushed several times with nitrogen and is heated from 150° to 250° C. in the course of 30 hours. The temperature is then held at 250° C. for a further 3 hours. When the melt which has formed has cooled down, 150 ml of DMF are added, the product is precipitated in 3.5 liters of diethyl ether, and the precipitated product is filtered off, washed with diethyl ether and dried in vacuo at 35° C. Yield: 36 g (97.74% of theory); Tg=40° C. Elemental analysis: calculated C 60.6 H 7.12%, found C 61.0 H 7.05%. η red. 0.32 dl/g (0 .5% solution in m-cresol at 25° C.).

(b) A reaction vessel which has been equipped with a 125-W Philips HPK mercury high pressure lamp, a nitrogen-inlet and -outlet, a reflux condenser, a dropping funnel and a magnetic stirrer is charged with 5.0 g of the polymer obtained in (a) and 60 ml of DMF. A solution of 2.38 g of dimethylmaleic anhydride and 250 mg of ethyl thioxanthone-7-methyl-3-carboxylat in 80 ml of DMF is added dropwise at 25° C. in the course of 3 hours under nitrogen. The solution is then irradiated for a further 18 hours. 25 ml of water are added, and the temperature is held at 90° C. for 3 hours. The polymer is then precipitated in 3 liters of diethyl ether and is dried at 25° C. in vacuo. Yield: 7.2 g. Tg=29° C. Elemental analysis: found C 56.8 H 7.06%. ηred.=0.22 dl/g (0.5% solution in m-cresol at 25° C.). Total acid content: 2.77 mEq/g (which corresponds to a circa 80% conversion of the C=C double bonds).

(c) 0.5 g of the polymer obtained in (b), 50 mg of N,N'-hexamethylenebis-dimethylmaleimide and 27.5 mg of ethyl thioxanthone-7-methyl-3-carboxylate are dissolved in 11 ml of chloroform, and the solution is applied to a copper conductor board by means of a 50 μm doctor. The coating is dried at 80° C. in the course of 3 minutes and is then exposed for 10 minutes through a step wedge of the type described in the preceding examples to the light of a 5,000-W high pressure lamp a distance of 70 cm away. The unexposed parts are washed out with 5% $Na_2CO_3$ solution in the course of 30 seconds. Final wedge step depicted: 3.

EXAMPLE 18

(a) 20.0 g of maleic anhydride, 29.42 g of 1,4-bis-(hydroxymethyl)-cyclohexane and 1.24 g of p-toluenesulfonic acid are suspended in 225 ml of benzene, and the suspension is refluxed for 6.5 hours with water being separated off. When the solution has cooled down the precipitated product is filtered off, washed with benzene and dried in vacuo at 20° C. Yield of polyester: 42 g (92% of theory). Tg=40° C. Elemental analysis: calculated C 64.27 H 7.19%, found C 63.60 H 7.07%. ηred.=0.40 dl/g (0.5% solution in m-cresol at 25° C.).

(b) 5.0 g of the polyester prepared in (a) are dissolved in 330 g of DMF, and the solution is introduced into a reaction vessel of the type described in Example 17(b). A solution of 2.11 g of dimethylmaleic anhydride and 250 mg of ethyl thioxanthone-7-methyl-3-carboxylate in 147 g of DMF is added dropwise at 25° C. in the course of 3 hours under nitrogen. After the solution has been concentrated down to 100 ml, the polymer is precipitated in 2 liters of diethyl ether and is dried in vacuo at 25° C. Yield: 6.8 g. Tg=57° C. Elemental analysis: found C 59.0 H 7.67%. ηred.=0.22 dl/g (0.5% solution in m-cresol at 25° C.). Total acid content: 0.98 mEq/g, which corresponds to a circa 22% conversion of the C=C double bonds of the polymer.

Two solutions are prepared by disslving 27.5 mg of ethyl thioxanthone-7-methyl-3-carboxylate, 50 mg of N,N'-hexamethylenebis-dimethylmaleimide and, in one case, 0.5 g of the polyester obtained in (a) in 11 g of DMF and, in the other case, 0.5 g of the polyester obtained in (b) in 11 g of chloroform. These solutions are applied to copper conductor boards by means of a 50 μm doctor and are dried at 90° C. in the course of 3 minutes. The coatings are exposed through a step wedge of the type described above to the light of a 5,000-W high pressure lamp a distance of 70 cm away. The results and developing details are given below.

| Polyester | Duration of exposure to light (minutes) | Developing solution | Developing time (minutes) | Final wedge step depicted |
|---|---|---|---|---|
| a | 2 | DMF | 0.25 | 9 |
|   | 10 | DMF | 0.25 | 14 |
| b | 2 | 5% NaOH | 25 | 1 |
|   | 5 | 5% NaOH | 25 | 4 |

What is claimed is:
1. A composition of matter which crosslinks under light in the presence of sensitisers and contains
(A) an aliphatically unsaturated polycondensation product
and
(B) a bisimide of the formula II

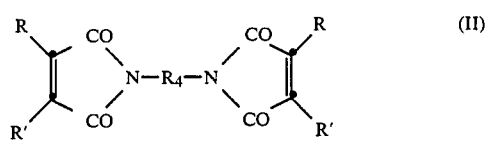

in which R and R' independently of each other are each $C_{1-4}$-alkyl or together teramethylene which is unsubstituted or substituted by a methyl group, or a grouping of the formula III

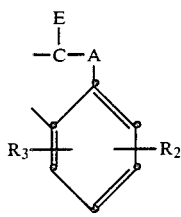
(III)

R$_2$ and R$_3$, independently of each other, are each hydrogen, halogen, C$_{1-4}$-alkyl or methoxy, A is —CH$_2$—, —CH$_2$CH$_2$— or —OCH$_2$— with oxygen bonded to the aromatic ring, and E is hydrogen, or A is —O— and E is 13 CH$_3$, R$_4$ is —C$_m$H$_{2m}$— with m=1 to 20, —(CH$_2$)$_x$Q(CH$_2$)$_{x'}$—, —(CH$_2$)$_2$NH(CH$_2$)$_2$NH(CH$_2$)$_2$—, —CH$_2$—Z—CH$_2$—, phenylene which is unsubstituted or substituted by one or two chlorine atoms or one or two methyl groups, naphthylene or a group of the formula

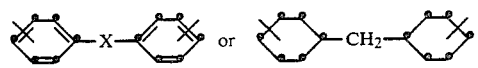

Q is —S—, —O— or —NH—, x and x', independently of each other, are each a number from 2 to 4, Z is phenylene or C$_{4-6}$-cycloalkylene, X is a direct bond, —O—, —S—, —SO$_2$—, —CH$_2$— or —C(CH$_3$)$_2$—, and the proportion of bisimide of the formula II is 0.1 to 75% by weight based on polymer (A), and (C) a photosensitizer.

2. A composition of matter according to claim 1, wherein the proportion of bisimide of the formula II is 1 to 25% by weight, based on polymer (A).

3. A composition of matter according to claim 1, wherein R and R' together are a grouping of the formula III in which E, R$_2$ and R$_3$ are each hydrogen and A is —CH$_2$—.

4. A composition of matter according to claim 1, wherein R and R' together are tetramethylene or 3- or 4-methyltetramethylene or are each methyl.

5. A composition of matter according to claim 1, wherein R$_4$ is straight-chain —C$_m$H$_{2m}$— with m=2-10, —(CH$_2$)$_2$Q(CH$_2$)$_2$— with Q=—S—, —O— or —NH—, —CH$_2$—Z—CH$_2$— with Z=1,3- or 1,4-phenylene or 1,3- or 1,4-cyclohexylene, the radical of 4,4'-diaminodiphenylmethane, 4,4'-diaminodiphenyl ether or 4,4'-diaminophenyl sulfide or 1,3- or 1,4-phenylene.

6. A composition of matter according to claim 1, wherein R and R' each are methyl, R$_1$ is hydrogen, Y and Y' together are —O—, and R$_4$ is —(CH$_2$)$_2$NH(CH$_2$)$_2$— or straight-chain —C$_m$H$_{2m}$— with m=2-10.

7. A composition of matter according to claim 6, wherein the sensitiser is an unsubstituted or substituted thioxanthone.

8. A composition of matter according to claim 1, wherein said polycondensation product is the polyester consisting of recurring structural elements of the formula VIa —O—CO—CH=CH—CO—O—R$_{11}$— (VIa)

or of formula VIa plus those of formula VIb, of formula Ia or of mixtures thereof

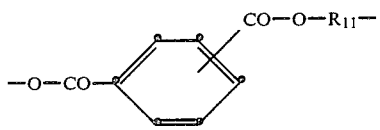
(VIb)

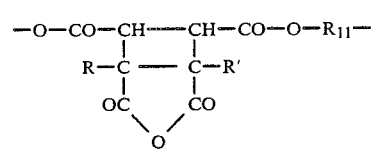
(Ia)

in which R and R' together are tetramethylene or are each methyl, R$_{11}$ is a group of the formula

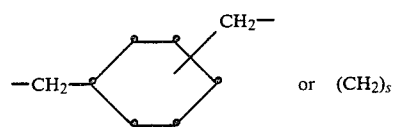
or (CH$_2$)$_s$ with s=2-12, and the proportion of structural elements of the formula Ia is up to 95% of the total number of recurring structural elements of the polyester.

9. A composition according to claim 8 wherein the polyester consists of structural elements of formula VIa or of formula VIa plus formula VIb.

10. A composition of matter according to claim 1, wherein said polycondensation product is the polyamide of recurring structural elements of the formula Va

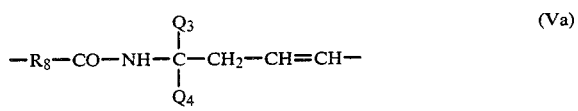
(Va)

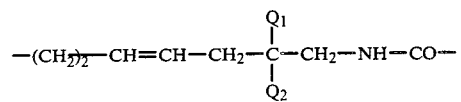

or of formula Va plus those of formula Ib, of formula Ic, of formulat Id or of mixtures thereof

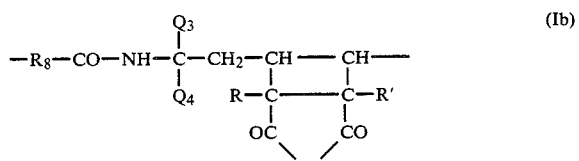
(Ib)

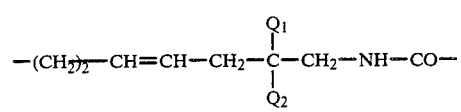

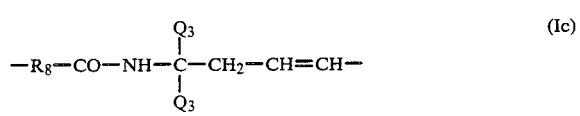
(Ic)

-continued

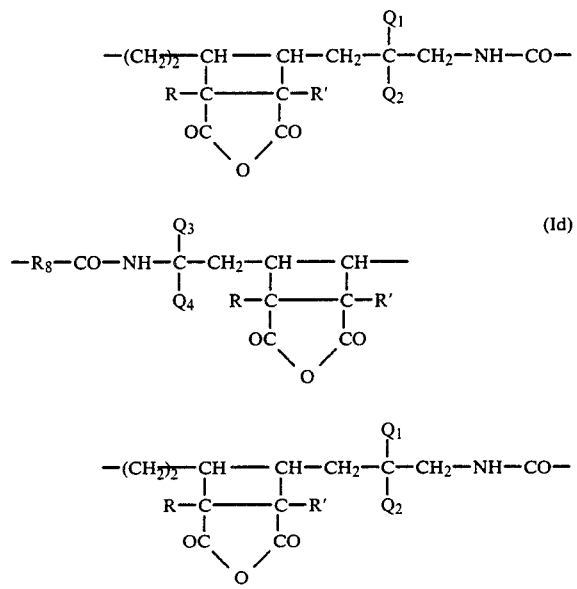

in which R and R' together are tetramethylene or are each methyl, $Q_1$ is $C_{1-12}$-alkyl, $Q_2$ is hydrogen or $C_{1-12}$-alkyl, $Q_3$ is $C_{1-12}$-alkyl, cycloalkyl having 4–12 ring carbon atoms, aralkyl having 7 or 8 carbon atoms, or phenyl, or $Q_1$ and $Q_2$ and/or $Q_3$ and $Q_4$ together are alkylene having 3–11 carbon atoms, and $R_8$ is the radical of terephthalic acid, isophthalic acid and/or of a saturated aliphatic dicarboxylic acid having 6–12 carbon atoms, the proportion of structural elements of th formulae Ib, Ic and/or Id is up to 95% of the total number of recurring structural elements of the polyamide.

11. A composition of matter according to claim 21, wherein $Q_1$ is methyl or ethyl, $Q_2$ is hydrogen, methyl or ethyl, $Q_3$ is $C_{1-5}$-alkyl or phenyl, $Q_4$ is hydrogen or methyl and $R_8$ is the radical of terephthalic acid, isophthalic acid and/or a saturated aliphatic dicarboxylic acid having 6–10 carbon ataoms.

12. A composition of matter according to claim 21, wherein the polymer consists solely of recurring structural elements of the formula Va in which $Q_1$ and $Q_2$ each are methyl, $Q_3$ is isopropyl, $Q_4$ is hydrogen, and $R_8$ is the radical of terephthalic acid and/or adipic acid.

13. Coated material containing a substrate to which a light-sensitive layer of a composition of matter according to claim 1 has been applied.

14. A composition of matter according to claim 1, wherein said aliphatically unsaturated polycondensation product contains structural elements of the formula I

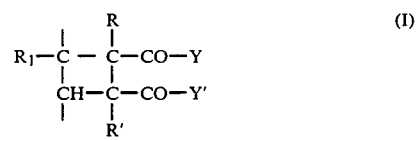

where R and R' are as defined in claim 1, $R_1$ is hydrogen or methyl, and Y and Y' are each —OH or together represent —O—.

15. A composition according to claim 10, wherein the proportion of structural elements of the formulae Ib, Ic and/or Id amounts to 20–90% of the total number of recurring structural elements of the polyamide.

* * * * *